United States Patent [19]
Avanzino et al.

[11] Patent Number: 5,916,855
[45] Date of Patent: Jun. 29, 1999

[54] CHEMICAL-MECHANICAL POLISHING SLURRY FORMULATION AND METHOD FOR TUNGSTEN AND TITANIUM THIN FILMS

[75] Inventors: Steven C. Avanzino; Christy Mei-Chu Woo, both of Cupertino; Diana Marie Schonauer, San Jose, all of Calif.; Peter Austin Burke, Austin, Tex.

[73] Assignee: Advanced Micro Devices, Inc., Sunnyvale, Calif.

[21] Appl. No.: 08/829,704

[22] Filed: Mar. 26, 1997

[51] Int. Cl.$^6$ .................. H01L 21/3105; H01L 21/306
[52] U.S. Cl. .......................... 51/307; 106/3; 51/308; 51/309; 438/693
[58] Field of Search .................. 106/3; 438/693; 216/89; 252/79.1; 51/307, 308, 309

[56] References Cited

U.S. PATENT DOCUMENTS

| | | | |
|---|---|---|---|
| 3,817,727 | 6/1974 | Yancey | 51/298 |
| 3,922,393 | 11/1975 | Sears, Jr. | 427/215 |
| 5,340,370 | 8/1994 | Cadien et al. | 51/308 |
| 5,527,423 | 6/1996 | Neville et al. | 106/3 |

FOREIGN PATENT DOCUMENTS

| | | |
|---|---|---|
| 0 561 132 A1 | 9/1993 | European Pat. Off. |
| 0 708 160 | 4/1996 | European Pat. Off. |
| WO 96/16436 | 5/1996 | WIPO |

OTHER PUBLICATIONS

Journal of the Electrochemical Society, vol. 138, No. 11, Nov. 1, 1991, pp. 3460–3465, Kaufman F B : "Chemical-Mechanical Polishing for Fabricating Patterned w Metal Features as Chip Interconnects".

Consumables for CMP of Dielectrics and Conductor, Rahul Jairath, et al., Mat. Res. Soc. Symp. Proc., vol. 337, pp. 121–131, San Francisco, CA, Apr. 4–8, 1994.

*Primary Examiner*—Melissa Koslow
*Attorney, Agent, or Firm*—Gerald M. Fisher

[57] ABSTRACT

A polishing slurry composition and its method of making for planarization of silicon semiconductor wafers by chemical mechanical polishing of the wafer. A slurry formulation utilizing a ferric salt tungsten oxidizer, an ammonium persulfate titanium oxidizer, a fatty acid suspension agent, alumina particles with a small diameter and tight diameter range, coated with a solubility coating, and a chemical stabilizer, provides high tungsten and titanium polish rates with high selectivity to silicon dioxide, and good oxide defectivity for use in tungsten local interconnect applications. A method for making a tungsten slurry includes first thoroughly blending small diameter alumina particles with a tight diameter range in an aqueous concentrate with a suspension agent, then mixing with water and oxidizers. Ferric salt tungsten slurries made by this method provide excellent tungsten polish characteristics for via plug and local interconnect applications.

53 Claims, 7 Drawing Sheets

CHEMICAL-MECHANICAL POLISHING SLURRY FORMULATION AND METHOD FOR TUNGSTEN AND TITANIUM THIN FILMS

CROSS REFERENCE TO A COMMONLY OWNED INVENTION

This invention has been concurrently filed with another commonly owned CMP slurry and method of making invention of the same inventors, entitled, Chemical -Mechanical Polishing Slurry Formulation and Method for Tungsten, AMD docket A972CIP, Ser. No. 08/824,666.

FIELD OF THE INVENTION

A polishing slurry composition for planarization of silicon semiconductor wafers by mechanical polishing of the wafer and its method of making. More particularly, a composition for polishing a wafer having tungsten lines over titanium or titanium nitride layers, and having tungsten filled vias through silicon dioxide dielectric layers, where the slurry has a high removal rate selectivity for the tungsten and Ti in relation to the silicon dioxide removal rate.

BACKGROUND OF THE INVENTION

Integrated circuit complexity has continued to evolve, placing increasingly more demanding specifications on the processes used in their manufacture. As the requirement for increasing the density of active devices on an individual chip has escalated, the requirement for greater flatness, over long distances and short distances, on the surfaces, top and bottom, of the wafer has also evolved. A flat surface is desirable for several reasons. Flatness is a requirement for cooperation with the optical focussing characteristics of optical stepper devices. As the optical lens requirements for increased resolution have increased, the depth of field of the lens has decreased. Also, attachment of the interconnection metallization to its underlayer is improved if the metal is not required to pass over abrupt underlying steps. In addition, flatness improves ability to fill via holes and lines through apertures in the dielectric.

Various processes have been used for planarization. One such process known as Chemical-Mechanical Polishing (CMP) is presently being used in the most demanding applications. CMP enhances the removal of surface material over large distances and short distances by simultaneously abrading the surface while a chemical etchant selectively attacks the surface. For this purpose, CMP utilizes a polishing slurry containing both an abrasive and a chemically active component.

It is known from the prior CMP efforts that for a particular CMP slurry to be successful it must exhibit significantly different removal rates for at least two different materials on the wafer surface. This is called selectivity and is normally shown as a different polish rate for the metal vis-a-vis the interlayer dielectric.

CMP is becoming a preferred method of polishing tungsten during formation of tungsten interconnects and contact/via plugs. A common use of tungsten metal in an integrated circuit is for contact/via plugs. Generally, for this application, a contact/via hole is etched through a dielectric layer to expose regions of the underlying devices (for first-level metallization) or metal interconnects (for higher levels of metallization). A Ti or TiN glue layer is deposited onto the sides and bottom of the contact/via hole, and tungsten is deposited thereon. CMP is used to remove the deposited tungsten from the wafer surface, leaving tungsten plugs in the contact/via holes having surfaces coplanar with the exposed dielectric. With proper process parameters, CMP tungsten processing has shown significantly improved process windows and defect levels over standard tungsten dry etch back processing for this application. One significant advantage of CMP tungsten processing is that it has a highly selective polish rate for tungsten as compared to the dielectric. This selectivity allows for over-polishing while still achieving a flat tungsten plug surface. When overetching using etch-back technology, the contact or via becomes further recessed which creates a serious disadvantage since overetching is frequently required to remove defects and to ensure complete removal of surface tungsten. The advantage of CMP, however, can be offset by the creation of significant levels of defects during polishing, such as scratches. Accordingly, the success of tungsten CMP processing performance for contact/via plug processing as well as tungsten interconnect processing is linked to improvements in selectivity and defect control.

Another important application of tungsten in integrated circuit manufacturing is for so-called local interconnects, conductive straps between circuit elements in close proximity to one another. One commonly used methodology for local interconnects utilizes the Damascene process. In this process a first metal is inlaid into the lowest dielectric layer, usually termed ILD0. This involves first depositing ILD0, then patterning and etching recessed trenches in the dielectric where the metal lines are to be placed. Contact to the underlying devices is made where the trenches pass over the active device regions; elsewhere the field oxide insulates the metal from the substrate. Generally, a sandwich structure of Ti, TiN, and tungsten is next deposited into the trenches and onto the dielectric surface. CMP is used to remove the conductive materials from the dielectric surface, leaving metal stripes in the trenches to function as local interconnects. For this application the CMP process must totally remove all conductive residues of tungsten, TiN, and Ti from the dielectric surface in order to prevent shorting between adjacent metal lines. This is because for the Damascene process, the next process step after CMP is the deposition of next level dielectric, which would leave buried shorts if conductive residues remained. In contrast, for contact/via plug technology, the CMP is followed by next level metal deposition, patterning, and etch, which would remove conductive residues from the dielectric surface during metal overetch. As a result, an optimal CMP process for local interconnects must have high polish rate selectivity of TiN and Ti over dielectric, as well as high polish rate selectivity of tungsten over dielectric. Additionally, the tungsten polish rate and Ti or TiN polish rates would ideally be comparable, so as to avoid erosion of the tungsten lines during Ti or TiN overpolish.

For various reasons, prior CMP slurries have not been as effective as needed. Deep or wide scratch defects of the underlying surface by the abrasive have caused problems. Simultaneous high tungsten and Ti polish rates have only been achieved at the expense of high selectivity to oxide polish rate. Also, since a large volume of CMP slurry is required, the development of a low-cost chemical composition with acceptable shelf life and chemical stability is essential.

SUMMARY OF THE INVENTION

It is an object of this invention to provide a practical tungsten CMP slurry having excellent selectivity of tungsten polish rate over dielectric polish rate, which enables removal of surface tungsten from a silicon integrated circuit wafer, resulting in a substantially planar surface, with a low defect count and excellent uniformity.

It is a further object of this invention to provide a practical tungsten CMP slurry having excellent selectivity of TiN and Ti polish rate over dielectric polish rate, which enables use of the slurry in CMP processing for local interconnect applications.

It is a further object of this invention to provide a practical tungsten CMP slurry having good chemical stability and a good shelf life.

These objects are achieved by: 1) formulating the slurry from abrasive particles coated with an organic acid salt such as ammonium phthalate, the particles having a sufficiently small median diameter and a very tight diameter variation, and by thoroughly premixing the abrasive particles with a suspension agent before combining the oxidizer(s), and 2) formulating the slurry from a combination of a ferric salt tungsten oxidizing agent, ferric nitrate by way of example, a Ti oxidizing agent, ammonium persulfate by way of example, and a chemical stabilizing agent, ammonium chloride by way of example.

A feature of this invention is that it provides a stable polish rate over a wide range of solid slurry content so that the process is more easily controlled.

DETAILED DESCRIPTION OF THE INVENTION

Figure 1:
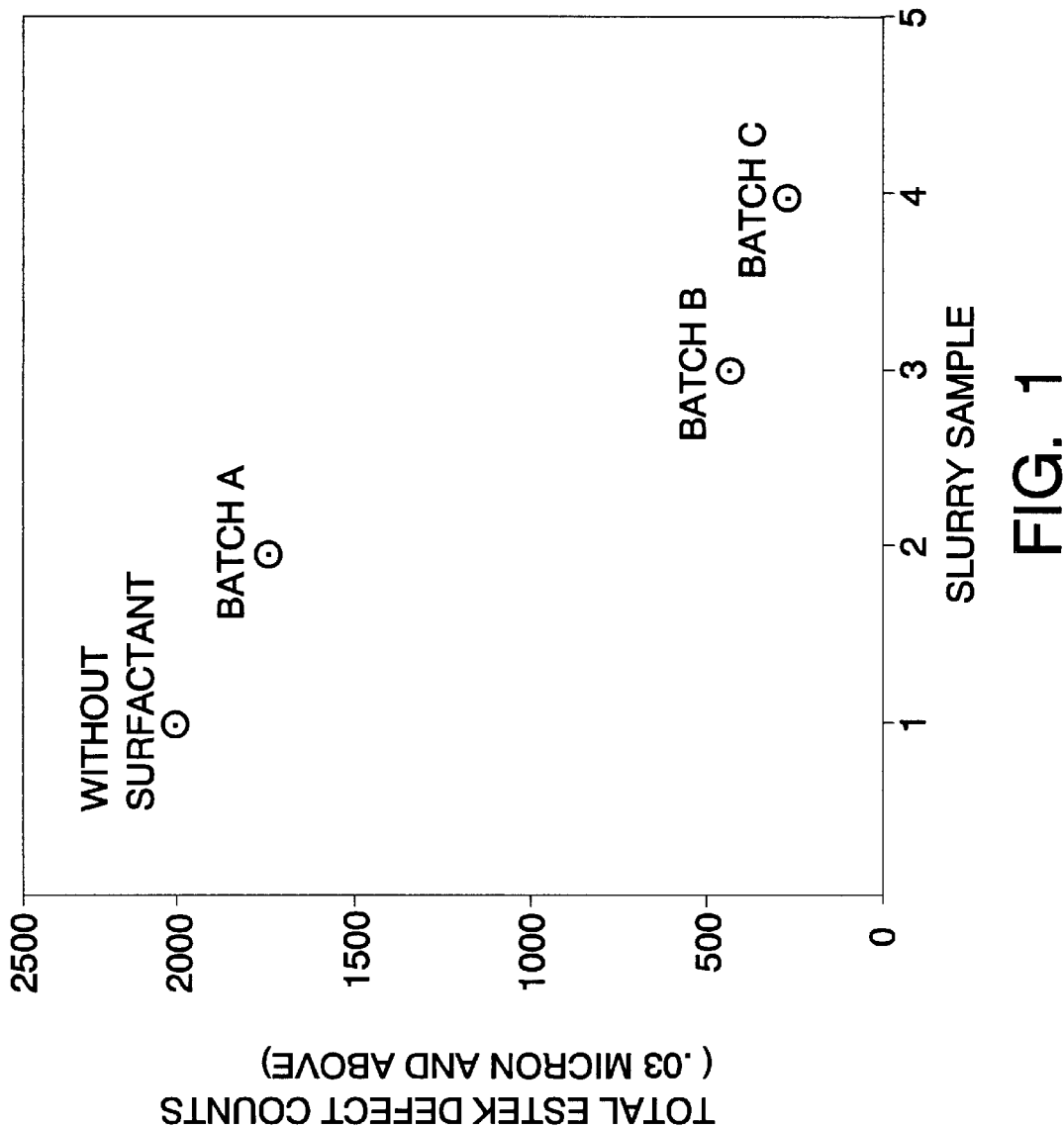
FIG. 1 illustrates oxide defect counts as a function of slurry preparation method in Experiment 1A.

Commercially available CMP equipment and slurry materials are currently available for planarization of integrated circuit wafers having tungsten vias through silicon dioxide layers. These commercial slurry materials each exhibit problems such as high scratch counts, high material cost, rapid settling, and poor selectivity of tungsten polish rate to oxide polish rate. We have developed a slurry and a slurry preparation method which substantially addresses and reduces these problems. We have further developed and refined the slurry, to provide for enhanced Ti and TiN polish rates for use in local interconnect applications, and to improve the chemical stability of the slurry.

A. Slurry Preparation Method

For a tungsten slurry comprising abrasive particles of a selected diameter, one or more oxidizing or complexing agents, and a suspension agent, we have discovered that it is beneficial to follow an order of adding and of mixing the slurry components for optimum results.

The abrasive particles can be any of the commonly used abrasives such as alumina ($Al_2O_3$), silicon carbide (SiC), Ceria ($CeO_2$), silicon nitride ($Si_3N_4$) and silicon dioxide ($SiO_2$). However, we have discovered that a small particle median diameter shows advantages and is preferred and that the size distribution from the preferred diameter median should preferably be very tight in order to obtain reduced scratch count. The median diameter of commonly used slurry particles are 0.400 microns, but for our slurry we prefer a median particle size of less than 0.4 microns, preferably 0.220 microns ±0.05 microns. The preferred distribution of particle size is much tighter than those generally used also. Our preferred distribution is a one sigma size distribution of 0.050 microns or less. We have determined through experimentation that both of these dimensions are important to achieve low incidence of scratching. Using standard optical measurement equipment, the particle sizes generally used in prior CMP slurries were measured to be in the range of 0.4 to 0.7 micron diameter or larger with little attention to the tightness of the distribution. For experiments 1A, 1B, and 2B described hereinafter, the abrasive used was a commercially available suspended alumina product XGB5518 from Rodel, Inc. The alumina particles in this product are 0.22 microns median particle size, with one sigma size distribution of 0.050 microns.

The preferred tungsten oxidizer is a ferric salt, selected from the group consisting of $Fe(NO_3)_3 \cdot 9H_2O$, $FeCl_3 \cdot 6H_2O$, $Fe_2(SO_4)_3 \cdot 5H_2O$, and $FeNH_4(SO_4)_2 \cdot 12H_2O$.

The suspension agent used in our experiments is sold under the trade name EVERFLO, from Universal Photonics Inc. It is a dispersion-type suspension agent comprising mostly water, but containing approximately 25% by weight of stearic acid and a vegetable-type oil in approximately equal amounts, and including small amounts of methyl paraben and propylene glycol. It acts not only as a surfactant, or surface wetting agent, but also improves the colloidal behavior of the abrasive particles in the $H_2O$ system. Other dispersion/type suspension agents may be used in place of the commercially available EVERFLO. Some examples are described hereinafter. Alternatively to the dispersion/type, the suspension agent might be formulated from the following classes of surfactants:

1) glycols such as ethylene glycol, propylene glycol and glycerol;
2) polyethers such as polyethylene glycol;
3) aliphatic polyethers;
4) alkyl sulfates;
5) alkoxylated alkyphenols.

We believe that CMP of tungsten films takes place by (1) a chemical oxidation of the tungsten surface with a suitable oxidizing agent in an aqueous solution; (2) followed by mechanical abrasion of the softer metal oxide which had formed on the surface by the solid abrasive particles present in the aqueous suspension. Both the oxidation and abrasion continue simultaneously and continuously. The reaction for oxidation of tungsten by the ferric ion is

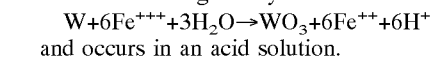

and occurs in an acid solution.

For the purposes of the slurry preparation method development, ferric nitrate $Fe(NO_3)_3$ was chosen as the tungsten oxidizer.

Experiment 1A

Utilizing a suspension agent, EVERFLO, in the slurry not only improved the colloidal suspension time but the suspension agent also had an unexpected, very significant effect on the defect scratch count level. The instrumentation counted all scratches of 0.3 microns and above. The suspension agent also unexpectedly affected the W polish rate selectivity over oxide. The order of mixing the slurry components also had an unexpected effect on the results.

Three different 2.5 gallon slurry batches were prepared, each batch having exactly identical ingredient ratios but being combined in a different sequence or manner of adding in the suspension agent:

Batch A: EVERFLO was added to container holding alumina and ferric nitrate, previously diluted with DI water to near the final volume.

Batch B: EVERFLO was added to alumina concentrate. After brief stirring to homogenize the mixture, diluted ferric nitrate was added up to the final volume.

Batch C: EVERFLO was added to alumina concentrate and mixed by a magnetically driven stirrer for 2 hours, then the diluted oxidizer, ferric nitrate, was added to make up the final batch volume.

Slurry composition for all three batches was:

$Al_2O_3$ concentrate @ 14 wt % $Al_2O_3$ solids: 20% of total slurry volume, or $Al_2O_3$ solids at 2.8 wt % of total slurry weight.

EVERFLO: 15% of total slurry volume

Ferric nitrate: 5 wt % of total slurry weight

D.I. water: 65% of total slurry volume

Equipment

Defect measurement: ESTEK, model 8500

Oxide removal and non-uniformity: Prometrix SM200

Tungsten removal and wafer non-uniformity: Prometrix RS55

Polisher: Strasbaugh 6DS-SP

Pads: Industry standard Procedure

Polishing in Strasbaugh carried out at 5 psi spindle down force, 25 rpm spindle rotation, 100 rpm table rotation.

A polishing pad was wet-idled overnight. The pad was pre-soaked with slurry for 2 min. Dummies with approx. 3000 angstroms of tungsten film were polished for 120 seconds, a total of two cycles for pad burn in. Next, two rate monitors with approx. 8000 angstroms of tungsten were polished for 60 seconds in one cycle. Then, two oxide-layered wafers were polished for 60 seconds to determine oxide removal rate. Lastly, two additional oxide wafers were polished for 10 seconds at 5 psi and 30 seconds at 2 psi for defect evaluation. Both oxide rate and defect monitor wafers had approx. 2500 Angstroms PETEOS. The polish pad was rinsed with DI water thoroughly between different slurry batches.

Figure 2:
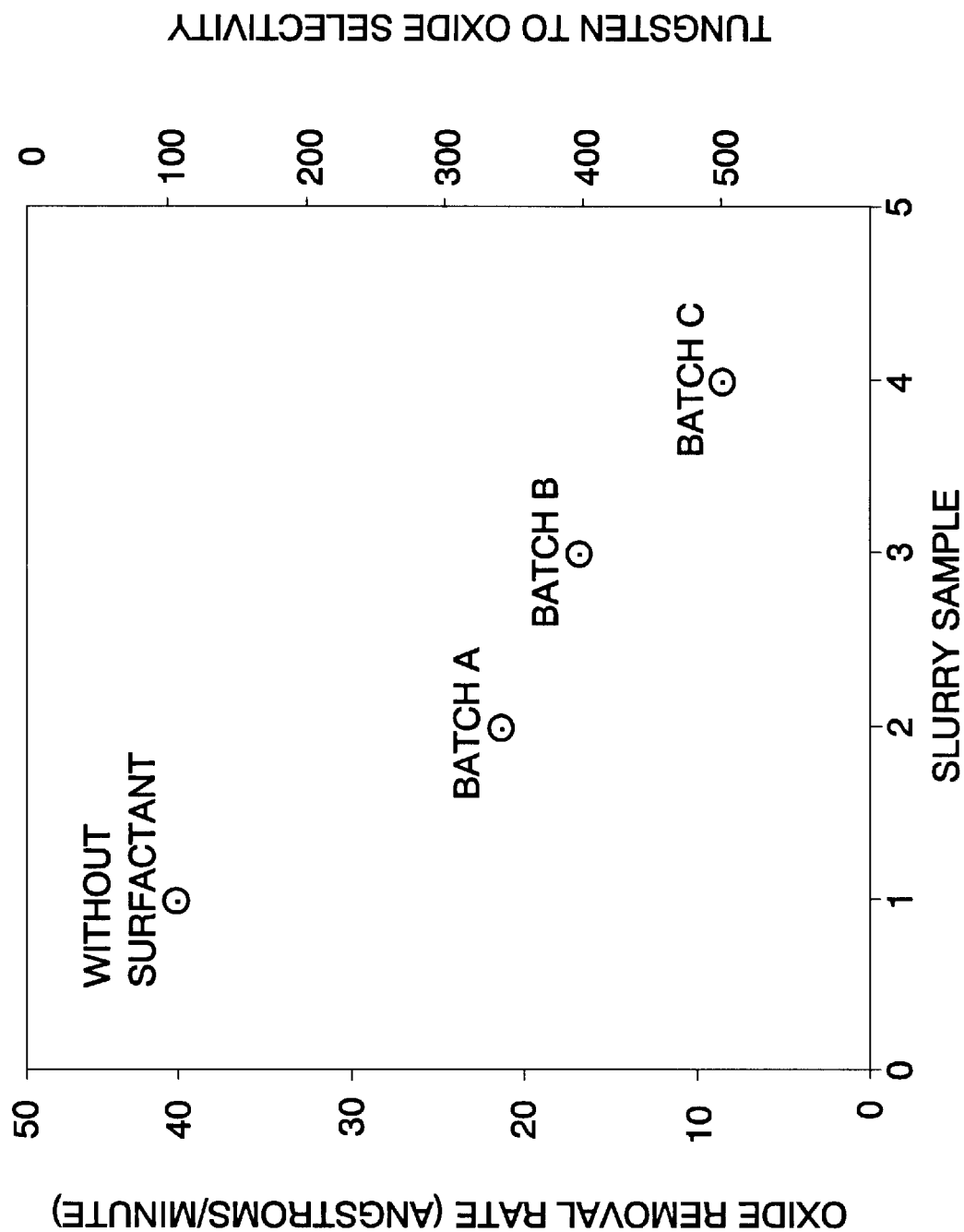
FIG. 2 illustrates oxide removal rate as a function of slurry preparation method in Experiment 1A.

FIG. 1 shows that when performing CMP using no suspension agent that approximately a total of 2000 defects of 0.3 microns or above are counted. For Batch A, where the suspension agent was added after diluting the abrasive and $Fe(NO_3)_3$ to near final volume, the data shows that the defects dropped only slightly to approx. 1800. A dramatic decrease in scratching to 400 counts is obtained with Batch B where the EVERFLO is added before the dilution and oxidizer with only minimal mixing. The result with Batch C employing a thorough pre-mixing and blending of the abrasive particles with the EVERFLO before dilution and oxidizer added was seen to reduce the defect count to less than 200. It is believed that the thorough mixing of the EVERFLO prior to addition of the oxidizer allows the suspension agent to engage and completely coat each alumina particle by nature of the organic surfactant molecules making the particle surface non-polar. It is believed that this precludes the particle from acquiring a charge from the oxidizer, thereby preventing agglomeration. Accordingly, when the particles are mechanically abraded across the W surface, the slurry particles remain smaller and cause less gouging. As seen in FIG. 2, the oxide removal rate (A/min) is also significantly different for each batch resulting in a very different selectivity which increases from 140:1 to over 400:1 depending on the mixing sequence.

The prior art teaches that tungsten to TEOS polish rate selectivity for CMP is less than 180, see D. Scherber and M. Neville, *Chemical and Mechanical Aspects of Consummables Used in CMP*, Semicon Southwest Proceedings, p. 36–60 (1994). Further, the known art teaches that high tungsten/TEOS selectivity requires reduced tungsten polish removal rate. As indicated above, our invention teaches that both of these limitations can be avoided.

It is believed that the observed benefits from following the aforementioned order of adding and of mixing the slurry components, including the small, tightly distributed abrasive particles, the oxidizer, and the suspension agent, will be similarly obtained in other polishing applications requiring control of the polishing performance of the slurry abrasive particle with respect to scratching, gouging and polish rate selectivity. This would include CMP of other interconnect materials such as Cu or Al.

Aging Tests

A previously unobserved effect was discovered when the slurry was aged. Using the same slurry preparation method and formulation as in Batch C, and using the same test procedure for measuring defect counts (scratching), the effects of aging the slurry were measured. Two test wafers were run and data obtained in one-day increments over a six-day aging period. The scratch count was seen to decrease dramatically over the six-day aging period. After six days aging, the defect count decreased to less than 10% of the one-day count value.

B. Slurry Formulation Development

Experiment 1B

Determining the range of slurry formulation which provided high tungsten removal rate was the first step to developing a slurry for both tungsten and Ti polish. Experiment 1B was performed to determine the relationship between the percentage of alumina solid content in a slurry and the tungsten removal rate. No suspension agent was employed in Experiment 1B. In this experiment, the oxidizer was ferric nitrate $Fe(NO_3)_3.9H_2O$, which was held constant at 5 weight percent (5 wt %). The results of various percentages of abrasion particles of alumina are plotted against the tungsten removal rate in FIG. 3. The experimental procedure and equipment for Experiment 1B were as follows:

| | |
|---|---|
| Equipment: | Strasbaugh model 6DS-SP polisher. |
| Wafer carrier: | Standard design. |
| Polish Pad: | Industry standard. |
| Test Monitor: | Pre-measured blanket tungsten films on Ti/TiN barriers over plasma TEOS oxide to monitor W removal rate and within wafer non-uniformity. |
| Dummy wafers: | Tungsten dummy wafers identical to test monitors described above, except for the W thickness pre-measurement. Oxide dummy wafers coated with 2500 A oxide. |
| Metrology tool: | Prometrix RS-55. Pre and post polish measurements taken on 49 sites across each wafer with 9 mm edge exclusion. |
| Slurry agitation: | Constant agitation during testing. |

-continued

PROCESS PARAMETERS

| | |
|---|---|
| Burn in: | New polish pads are burned in with 2 cycles of 120 seconds polish time/cycle using oxide dummy wafers. |
| Process Cycle: | variable time, 5 psi, 25 rpm carrier, 100 rpm table, 150 ml/min slurry flow. |
| Loading Sequence: | For each of seven slurry mixture test compositions selected, perform polish test on 8 tungsten dummywafers for 220 sec. and 4 tungsten test monitor wafers for 60 seconds. |
| Test Compositions: | $Al_2O_3$ — 1 wt %, 2 wt %, 3 wt %, 4 wt %, 5 wt %, 6 wt % and 7 wt %. The $Fe(NO_3)_3 \cdot 9H_2O$ is fixed at 5 wt % for all slurries used in Experiment 1B. |

Figure 3:
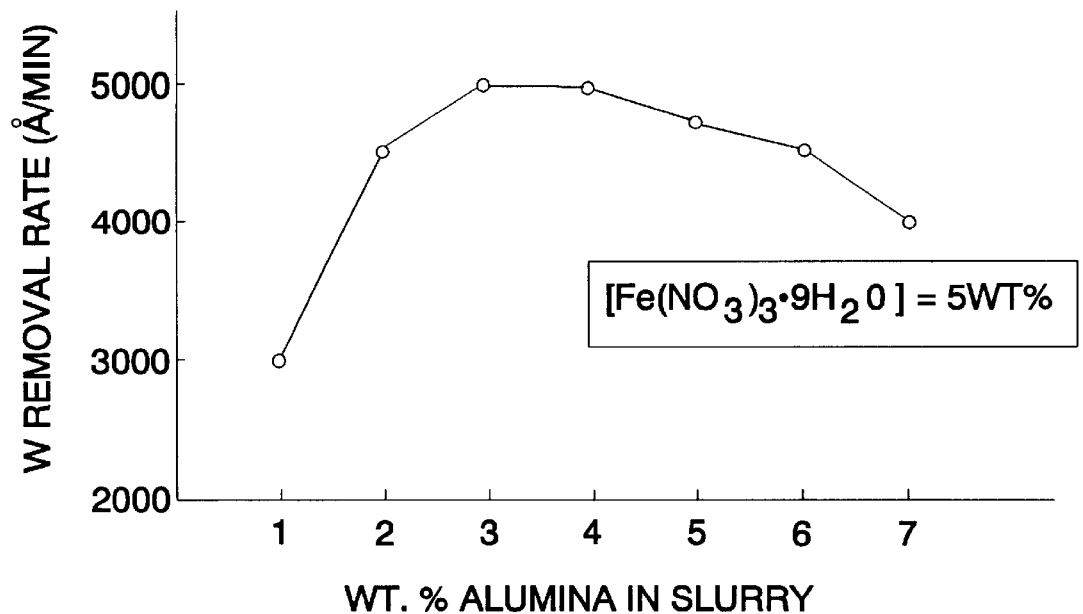
FIG. 3 is a graph of tungsten removal rate as a function of alumina wt % in Experiment 1B.

The results of this experiment, as shown in FIG. 3, show nearly constant tungsten removal rate of 4500A/min—4900 A/min for 2–6 wt % of $Al_2O_3$ abrasion particles. Below 2 wt % the removal rate is substantially reduced. In the flat region, the removal rate is essentially independent of the alumina concentration. This suggests that the removal rate depends more on the oxidation rate of the elemental tungsten near the surface and that at these wt % of particles the tungsten oxide is being removed about as fast as it is being formed. It is not understood why the curve shows a removal rate drop-off at the alumina percentages above 6 wt %.

The prior CMP tungsten polishing publications teach that the polishing rate is linearly proportional to the concentration of the alumina particles in the concentration range of 3 to 7 wt %. However, our experiment shows that the lower concentration can sustain the high polishing rate if the alumina particle is appropriately sized and has the proper size distribution. It appears that certain particle sizes contribute more to polishing. Larger particles when mixed with smaller particles may hinder the polishing performance of the smaller particles by maintaining too large a distance between the wafer and the polishing pad.

Experiment 2B

Figure 4:
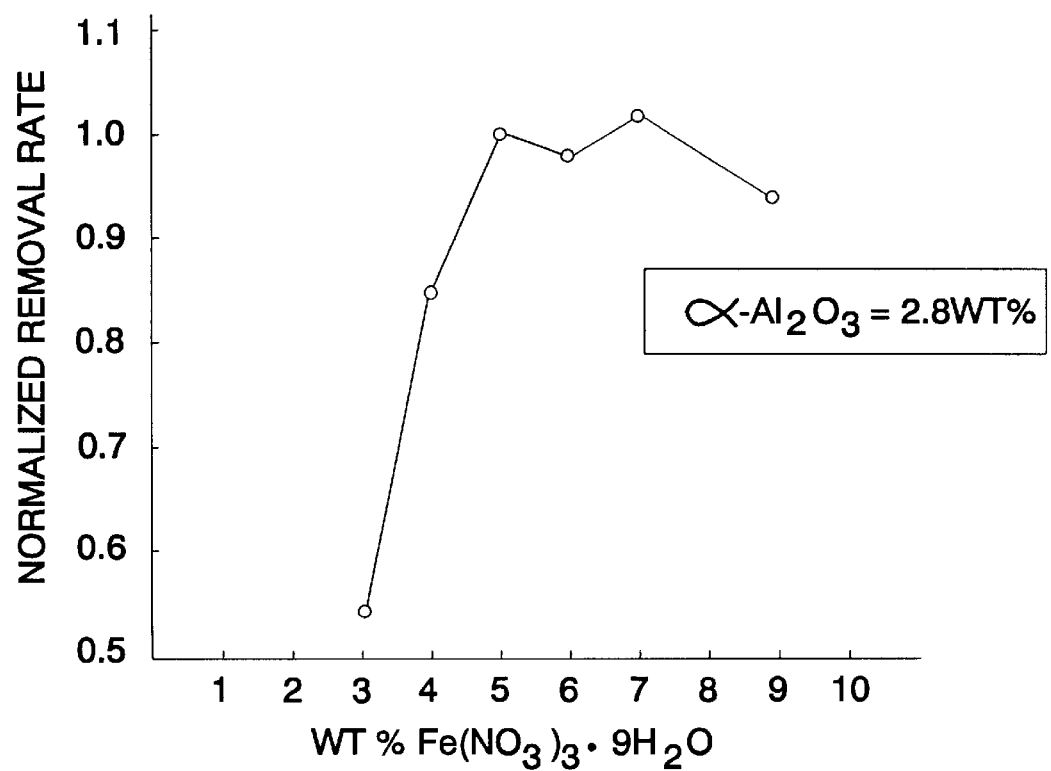
FIG. 4 is a graph of tungsten removal rate as a function of ferric nitrate wt % in Experiment 2B.

Tungsten removal rate as a function of weight percent of ferric nitrate is shown in FIG. 4. The same experimental procedure and equipment were used as set forth in Experiment 1B except that the test points for this experiment held the alumina at 2.8 wt % and varied the wt % of ferric nitrate between 3 and 9 wt %. The results are plotted normalized against removal rate for 5 wt % ferric nitrate. The results show a strong tungsten removal rate dependence on concentration of $Fe^{3+}$ between 3 wt % and 5 wt % ferric nitrate. As $Fe^{3+}$ concentration is further increased, ie, from 5 wt % to 9 wt % ferric nitrate, the removal rate is nearly constant.

This behavior suggests that below 5 wt % ferric nitrate concentration the polish rate is controlled by the chemical oxidation rate of the freshly exposed W surface undergoing continuous abrasion by $A_2O_3$ particles. Above 5 wt % ferric nitrate, the increased $Fe^{3+}$ concentration does not lead to a higher polish rate, which suggests that surface WOX abrasion rate becomes the rate limiting mechanism.

Slurries were made using the same method as Batch C, Experiment 1A, but with the various other ferric ($Fe^{3+}$) salts mentioned above, and the results show that each of the salts can be successfully used to formulate the tungsten polishing slurry.

Tungsten/Titanium slurry formulation development

The tungsten slurry as described above has been further developed and refined so as to provide an accelerated removal rate of Ti polish while maintaining favorable tungsten polish rate and characteristics. Polishing data has been obtained for a wide variety of different slurries which utilize chemical oxidizing agents and/or complexing agents having a high likelihood to oxidize elemental titanium or to form stable complex ions with oxidized titanium. The oxidizing agents studied were selected based on the criteria of 1) their oxidation potential, 2) distinct differences in the chemical structure of the oxidizing ion (to span a range of possible Ti oxidation mechanisms), 3) their solubility, 4) ease and safety of use, and 5) cost. The complexing agents were selected based on the reported thermodynamic stability of the complex ion they form with Ti, and hence the driving force for the reaction to dissolve an oxidized Ti atom.

These slurries were prepared using an aqueous alumina suspension, EVERFLO White suspension agent, and the oxidizing agents and/or complexing agents. The concentrations of alumina and suspension agent used and the method of preparation of the slurries were the same as for Batch C of Experiment 1A. Although EVERFLO was 15% of the total volume for these experiments, it is thought that the range between 10 and 30 volume % will yield acceptable results. (The slurry preparation method and formulation of Experiment 1A, Batch C will hereinafter be referred to as the best mode tungsten plug slurry. Process parameters were similar to those of Experiment 1B.

On the basis of the observed Ti polish rates using the different oxidizing and complexing agents, as well as chemical compatibility and stability considerations, ammonium persulfate was chosen as the best candidate for combining with the tungsten oxidizing agent to form a tungsten/Ti slurry. Other persulfate compounds such as potassium persulfate or sodium persulfate could be substituted in applications where mobile ions are not a concern. Other acceptable Ti polishing agents, particularly for applications not requiring high polish rate selectivity to oxide, include citric acid, ceric ammonium nitrate, potassium iodate, and hydrogen peroxide. Further characterization studies will be described hereinafter.

Figure 5:
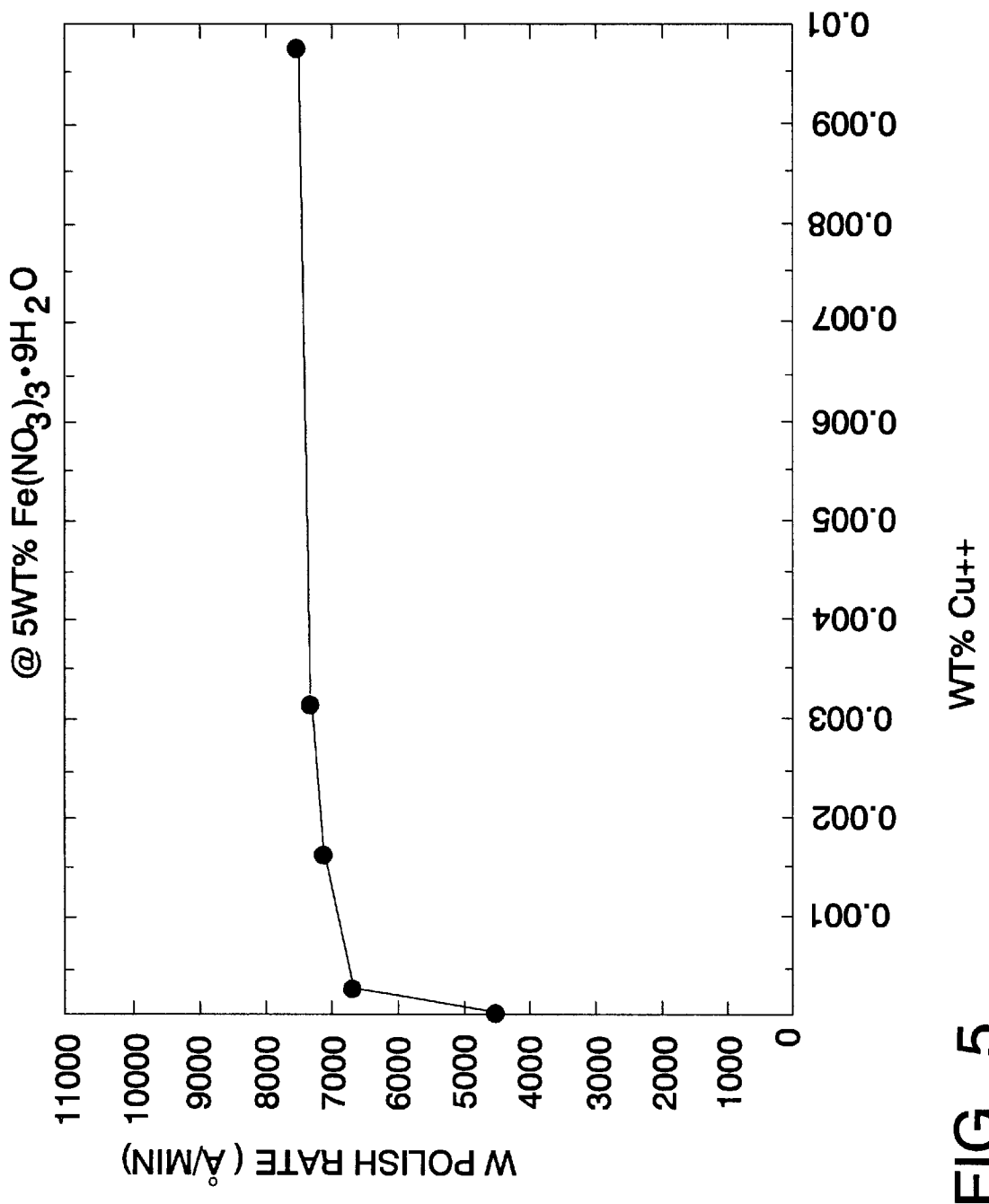
FIG. 5 is a graph of tungsten removal rate as a function of $Cu^{2+}$ concentration.

During the course of the aforementioned evaluations of Ti oxidizing agents, a totally unexpected result occurred for slurry containing a ferric nitrate/cupric sulfate oxidizer pair. The slurry displayed an exceptionally fast tungsten polish rate of 9300A/min, 60% faster than for the same slurry formulation without the cupric sulfate, although only a trace (0.01 wt %) of cupric sulfate was used. Cupric sulfate and cupric nitrate both provide $Cu^{2+}$ ions to the slurry, and additional ferric nitrate slurries containing 0.0003 to 0.01 wt % $Cu^{2+}$ ions from cupric nitrate were prepared and tested. The best mode tungsten plug slurry formulation and method were used, with added cupric nitrate. FIG. 5 shows the tungsten polish rate as a function of the concentration of $Cu^{2+}$ ions added to the ferric nitrate slurry. Trace amounts of as little as 0.0003 wt % $Cu^{2+}$ substantially increase the tungsten polish rate. Experiments using slurries formulated with $Cu^{2+}$ ions and no ferric nitrate show tungsten polish rates consistent with mechanical abrasion only. It is therefore concluded that the $Cu^{2+}$ enhances the tungsten polish rate for the ferric nitrate by a catalytic reaction mechanism. The enhanced tungsten polish rate of the ferric nitrate/cupric sulfate or ferric nitrate/cupric nitrate slurries has potential application for reducing processing time and cost when removing thick tungsten layers.

The effect of adding ammonium persulfate oxidizer on the tungsten and titanium polish rates is illustrated in Tables I and II. Tables I and II show experimental characterizations of ferric nitrate/cupric nitrate slurries for tungsten and titanium polish.

TABLE I

Effect of added ammonium persulfate on polish rates and defectivity.

| Slurry #/Formulation | W/Ti polish rates | Oxide defectivity |
|---|---|---|
| 1. $Fe(NO_3)_3 \cdot 9H_2O$ 3 wt % $(NH_4)_2S_2O_8$ 1 wt % cupric nitrate .036 wt % | W: 6300 A/m Ti: 2002 A/m | Few (~1–2) shallow $\mu$-scratches every FOV @ 300X. No pits. |
| 2. $Fe(NO_3)_3 \cdot 9H_2O$ 3 wt % cupric nitrate .036 wt % | W: 4400 A/m Ti: 408 A/m | Very clean. Almost no $\mu$-scratches. No pits. |

Slurries 1 and 2 of Table I were prepared by the method of the best mode tungsten plug slurry and with the formulations shown in the table, with slurry 1 having added ammonium persulfate as indicated, and slurry 2 serving as a control. The two slurries were then used to polish tungsten Ti, and $SiO_2$ test wafers, yielding the polish rates and defectivities listed. A single mask layer Contact 1 patterned wafer with Ti/TiN/W filled plugs was polished with slurry 1 for 120 sec. For slurry 1 all the metal films, including the Ti, were removed cleanly from the surface. No residual Ti was observed by microscope inspection, and no obvious surface scratches were observed on the $SiO_2$. Ti removal rate using slurry 1 (containing the ferric nitrate/ammonium persulfate oxidizer pair) was substantially enhanced over the rate achieved using slurries such as slurry 2 containing ferric nitrate only or containing persulfate only.

TABLE II

Effect of varying ammonium persulfate concentration on W and Ti polish rates and defectivity.

| Slurry #/Formulation | W/Ti polish rates | Oxide defectivity |
|---|---|---|
| 3. $Fe(NO_3)_3 \cdot 9H_2O$ 3 wt % $(NH_4)_2S_2O_8$ 0.3 wt % cupric nitrate .036 wt % | W: 5082 A/m Ti: 1753 A/m | Few shallow $\mu$-scratches @ 300X |
| 4. $Fe(NO_3)_3 \cdot 9H_2O$ 3 wt % $(NH_4)_2S_2O_8$ 0.1 wt % cupric nitrate .036 wt % | W: 4160 A/m Ti: 1547 A/m | Very few shallow $\mu$-scratches @ 300X |
| 5. $Fe(NO_3)_3 \cdot 9H_2O$ 3 wt % $(NH_4)_2S_2O_8$ 0.03 wt % cupric nitrate .036 wt % | W: 3875 A/m Ti: 762 A/m | Very few shallow $\mu$-scratches @ 300X |

Figure 6A:
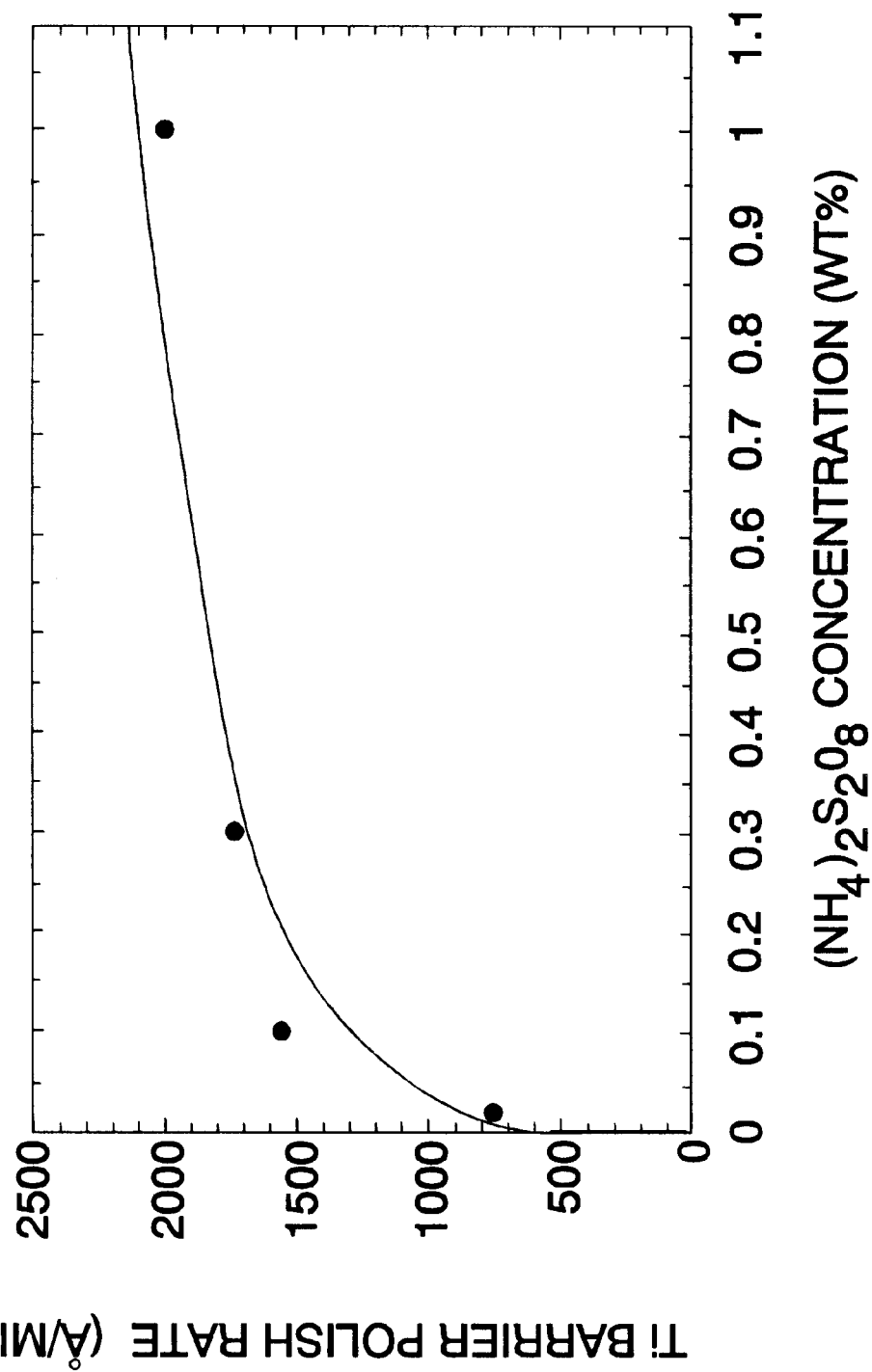
FIG. 6a is a graph of titanium removal rate as a function of ammonium persulfate concentration.
Figure 6B:
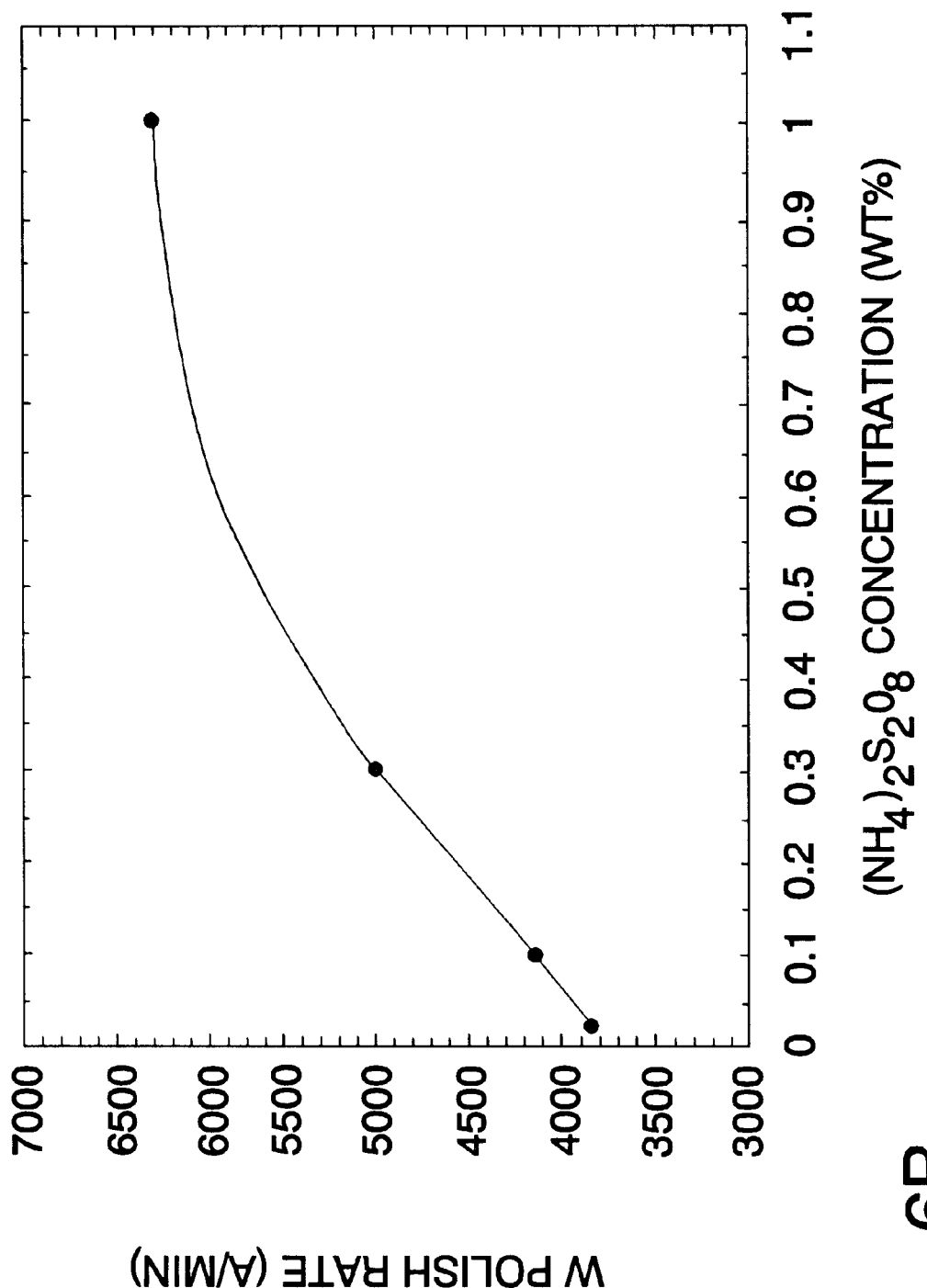
FIG. 6b is a graph of tungsten removal rate as a function of ammonium persulfate concentration.

Slurries 3–5 of Table II were also prepared by the method of the best mode tungsten plug slurry, and ammonium persulfate concentrations were varied as indicated. Slurries 3, 4, and 5 were used to polish W, Ti, and $SiO_2$, wafers about 16 hours after the time of preparation. The Ti removal rate and W removal rate versus the ammonium persulfate concentration are plotted in FIG. 6a and FIG. 6b, respectively. The Ti removal rate is seen to decrease gradually from 2000 A/min to 1500 A/min down to 0.1 wt % persulfate, then decreases sharply at lower concentration. The W removal rate changes fairly linearly.

The preferred embodiment of the tungsten/Ti slurry of this invention, hereinafter referred to as the Local Interconnect, or "LI" slurry formulation, utilizes the ferric nitrate/ammonium persulfate oxidizer pair, the development of which is described above. Additionally, it utilizes an alumina abrasive suspension wherein the alumina particles are coated with an organic acid salt, ammonium hydrogen phthalate, $(NH_4)HC_6H_4(CO_2)_2$. Table III below illustrates the advantageous effects of using the coated abrasive.

TABLE III

Effect of coated abrasive on W and Ti polish rates and oxide defectivity

| Slrry # | OrgAc Salt | Evrflo | $Fe^{3+}$ | $S_2O_8^{2-}$ | W Rate | Ti Rate | $SiO_2$ Rate | Defectivity |
|---|---|---|---|---|---|---|---|---|
| 6 | Yes | Yes | 5% | No | 4275 | 300 | 21 | 5000–10000 |
| 7 | No | Yes | 5% | No | 1057 | 520 | 38 | >10000 |
| 8 | Yes | Yes | 5% | 1% | 6872 | 1004 | 29 | 482, shall. scrtchs |
| 9 | No | Yes | 5% | 1% | 3193 | 458 | 29 | 5000–10000 |
| 10 | No | No | 5% | No | 8100 | 1000 | 129 | >10000 |

Slurries 6–10 have been formulated with alumina particles with the average size and size distribution as described earlier for the best mode tungsten plug slurry, either uncoated or coated with ammonium hydrogen phthalate, and either using EVERFLO as a suspension agent or with no added suspension agent. The slurries all contained ferric nitrate, some contained ammonium persulfate. The polishing rates of tungsten, Ti, and $SiO_2$ were measured, as well as the oxide defectivity. The results are summarized in Table III.

Slurry 10 comprising uncoated dispersed alumina and ferric nitrate has an extremely high W polish rate, and a relatively fast Ti polish rate. However, the oxide polish rate is also higher than desired, and oxide defectivity is high. Addition of EVERFLO suspension agent, as in Slurry 7 lowers the W polish rate by over 85%, and lowers the Ti rate by 50%, still with high oxide defectivity, although the oxide polish rate is significantly lowered. Addition of the ammonium persulfate, as in Slurry 9, increases the W polish rate while maintaining a low oxide polish rate and somewhat lowered oxide defectivity. However, the Ti polish rate is still low. Utilizing the coated alumina without added persulfate, as in Slurry 6, further increases the W polish rate while maintaining low oxide polish rate, however the Ti polish rate is further lowered. The best results are obtained from Slurry 8 containing the alumina coated with the ammonium hydrogen phthalate salt as well as the ammonium persulfate and the EVERFLO. W and Ti polish rates are high, oxide polish rate is low, and the oxide defectivity is greatly improved.

We believe that the interaction between the phthalate coating and the EVERFLO to produce desired polishing characteristics can be explained as follows:

EVERFLO is not only a surfactant, or a surface wetting agent. It is a 2-phase medium comprising mostly water, but containing approximately 25% by weight of fat-type or oil substances, which form an emulsion when the right amounts of additives such as glycols or alcohols are added. Our analysis of EVERFLO indicates that the principal components of the non-aqueous phase are an approximately equal mixture of stearic acid (a fatty acid) and a vegetable-type oil, such as cottonseed oil. Much of the fatty acid is dissolved in the oil. By itself, EVERFLO will slowly separate, with the oil/fat droplets rising. When alumina particles are added, they associate with the oil/fat droplets in the emulsion, and the rising tendency of the oil/fat droplets counteracts gravity which would settle the alumina particles. Thus the association of the alumina with the oil/fat of the EVERFLO acts to keep the alumina particles in suspension. In addition, the EVERFLO coats the working surface and forms a lubricant. EVERFLO is only one example of this dispersion/emulsion type of suspension agent. Other non-polar substances that are only slightly soluble in water can be used, such as the class of fatty acids of which stearic acid, palmitic acid, myristic acid, and lauric acid are examples, and the class of oils and fats, of which coconut oil, palm oil, and peanut oil are examples.

Figure 7:
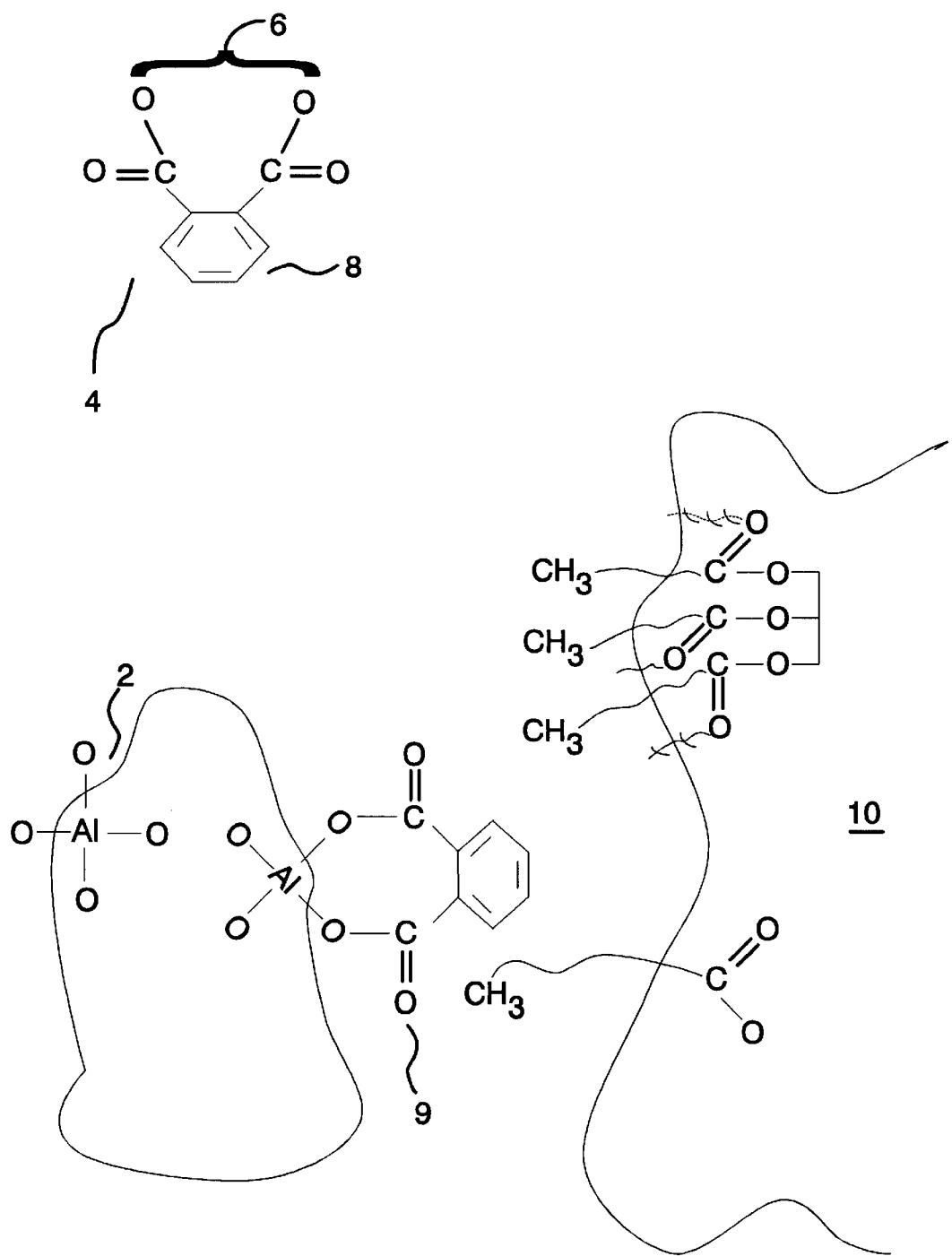
FIG. 7 illustrates alumina particles coated with phthalate when mixed with a fatty acid suspension agent.

When the alumina particles are coated with the ammonium hydrogen phthalate, the association of the alumina with the oil/fat droplets of the EVERFLO is enhanced. This effect is illustrated in FIG. 7. The uncoated alumina surface 2 presents like a positively charged polar salt. The dissociated phthalate ion 4 has a negatively charged polar end 6 and an uncharged end 8. The polar end 6 of the phthalate will chemically react with the positively charged alumina surface 2, such that the non-polar end 8 of the phthalate forms a hydrophobic coating of phthalate groups on the alumina particles extending outward toward the solvent medium. The coated alumina 9 will thus present more like a fat or oil, rather than a polar salt. It will then be more miscible with the oil/fat droplets 10 from the EVERFLO, due to attractive forces between the non-polar fat/fatty acid and the non-polar shell of aromatic phthalate groups coating each $Al_2O_3$ particle. The ammonium hydrogen phthalate as a result will be hereinafter described as a solubility coating.

When EVERFLO is used, a lubricating fat/fatty acid film forms on the wafer surface. The enhanced ability of the coated alumina to move through the fatty phase of the EVERFLO permits easy and frequent contact to the wafer surface of the hard $Al_2O_3$ particles. Even with the reduced frictional force between the alumina and the surface due to the lubricating effect of the EVERFLO, the alumina particles can easily remove the soft oxidized tungsten layer from the wafer surface, yielding a high tungsten polish rate. However, the hard silicon dioxide layer and the relatively hard titanium polish slowly due to the lubrication of the surface. The addition of the titanium oxidizing agent ammonium persulfate counteracts the lubricating effect by enhancing formation of a softer, hydrated titanium oxide and raises the titanium polish rate. The charge-neutralized phthalate coated alumina particles will not be attracted to the negatively charged silicon dioxide surface, thereby eliminating impact of energetic alumina particles as a source of oxide defects. The slurry preparation method of this invention, wherein the alumina particles are first thoroughly mixed and blended with the EVERFLO suspension agent before adding the oxidizing agents, enhances the aforementioned benefits. In addition to other phthalate compounds such as phthalic acid, diammonium phthalate, and mono- or di- potassium or sodium phthalate, other compounds which are known to form strong complex ions with $Al^{3+}$ and which may be expected to effectively coat the surfaces of alumina particles and to enhance $Al_2O_3$ solubility in the fatty acid suspension agent include:

1) acetyl acetonate ($C_5H_7O_2^-$) compounds such as: sodium acetylacetonate monohydrate; potassium acetylacetonate hemihydrate;
2) succinate ($C_4H_4O_4^{2-}$) compounds such as: succinic acid; ammonium succinate; sodium succinate; potassium succinate;
3) naphthalene dicarboxylate ($C_{10}H_6(COO)_2^{2-}$) compounds such as: 2,3-naphthalene dicarboxylic acid; 2,6-naphthalene dicarboxylic acid.

In determining the optimum concentration of the ammonium hydrogen phthalate salt to use, it is seen that the salt tends to precipitate out of the suspension as large granules, so that its concentration should preferably be reduced below the practical solubility limit in the abrasive suspension. Five different coated alumina suspensions were tested, ranging from an ammonium hydrogen phthalate concentration of approx. 6.4 wt % down to approx. 2.6 wt % of the aqueous alumina suspension or concentrate. Slurries were prepared from these different alumina concentrates and tested for tungsten polish rate, Ti polish rate, and oxide defectivity. Slurry formulations included ferric nitrate oxidizer alone ("plug formulation") and ferric nitrate/ammonium persulfate oxidizer pair ("LI" formulation).

TABLE IV

Effect of varying phthalate coating concentration.

| Slurry # | Phthalate conc. | W polish rate A/m | Ti polish rate A/m |
|---|---|---|---|
| 11 | 6.4 wt % | 4757 | 1555 |
| 12 | 5.5 wt % | 4875 | 1578 |
| 13 | 4.5 wt % | 5921 | 1638 |
| 14 | 3.5 wt % | 5318 | 1337 |
| 15 | 2.6 wt % | 7040 | 1416 |

Table IV summarizes the tungsten and Ti polish rates for LI slurries formulated with different phthalate coating concentrations on the alumina. It is seen that the tungsten and Ti polish rates are acceptable for all the alumina formulations tested. Tungsten polish rates with all the alumina formulations were also acceptable for the plug slurries without ammonium persulfate (not shown on the Table). However, these ferric nitrate/ammonium persulfate LI slurries showed a distinct increase in micro-scratch oxide defects when the phthalate additive concentration decreased from 4.5 to 3.5 weight percent. This effect, combined with the observed precipitation of approx. 15% of the phthalate salt when using the 6.4 wt % additive concentration, have contributed to our choice of 4.5 wt % ammonium hydrogen phthalate additive as the contemplated best mode. The acceptable range of phthalate wt % is considered to be 4.0–5.5 wt %. This corresponds to a range of 0.8–1.1 wt % ammonium hydrogen phthalate in a slurry mixture with 20 volume% abrasive particle concentrate.

It has been found that the addition of ammonium chloride ($NH_4Cl$) to the ferric nitrate/persulfate slurry is desirable to stabilize the slurry and to prevent unwanted chemical reactions from decomposing the mixed ingredients. Chemical instability of the slurry is evidenced by discoloration observed over a period of hours after first mixing. The literature suggests that many organic free-radical polymerization reactions can be initiated with persulfate compounds, or with so-called "redox" initiators such as persulfate-ferrous solutions. This suggests the likelihood that the desired $Fe^{3+}/S_2O_8^{2-}$ oxidizer combination for the slurry will cause incompatibility problems with the dissolved phthalate species. Chloride compounds can act to inhibit or retard free-radical type reactions, even though initiators such as $Fe^{3+}/S_2O_8^{2-}$ are present. We have observed experimentally that the degree of slurry decomposition, as evidenced by the extent of discoloration, is inversely related to the concentration of ammonium chloride used. Although 0.7 wt % ammonium chloride results in very minimal decomposition, the discoloration will continue to decrease when higher concentrations of $Cl^-$ are used, and no discoloration is seen at 2 wt % ammonium chloride. 0.7 wt % ammonium chloride was utilized during the oxidizer optimization studies described hereinafter. Other soluble chloride compounds such as potassium chloride, sodium chloride, and $FeCl_3$ could be used in place of ammonium chloride.

To optimize the slurry so as to yield a tungsten to Ti polish rate selectivity providing minimum line dishing and pattern erosion of the tungsten local interconnect, several LI slurries with varied concentrations of ferric nitrate were tested, to vary the tungsten/Ti polish rate ratio. The results of polishing Damascene test structures are summarized in Table V. These experiments demonstrate that using the ferric nitrate/ ammonium persulfate oxidizer pair it is possible to independently control the tungsten and Ti polishing rates of the slurry.

TABLE V

Effect of varying W/Ti selectivity on dishing and erosion.

| Slurry # and Formulation | W polish rate (A/min) | Ti polish rate (A/min) | Erosion @ 50%/ Dishing @ 10 μm |
|---|---|---|---|
| 16. $Fe^{3+}$ 5% $S_2O_8^{2-}$ none $Cl^-$ none | 5800 | 300 | — 2900A |
| 17. $Fe^{3+}$ 5% $S_2O_8^{2-}$ 2% $Cl^-$ 0.7% | 5902 | 1488 | 1700/2200A |
| 18. $Fe^{3+}$ 2% $S_2O_8^{2-}$ 2% $Cl^-$ 0.7% pH adjusted to 1.4 | 7539 | 2010 | 2000/1600A |
| 19. $Fe^{3+}$ 1.5% $S_2O_8^{2-}$ 2% $Cl^-$ 0.7 % | 1322 | 1434 | 3499/3000A |

It is seen that dishing and erosion are severe for slurry 19, wherein the W polish rate is slow and therefore long polish times are required to remove all film residues. Likewise, dishing and erosion are severe for slurry 16 where the last-removed film layer, i.e., Ti, is polished at a slow rate. Dishing and erosion are minimized for slurries 17 and 18, where tungsten and Ti both have fast polishing removal rates, resulting in good tungsten planarization and rapid removal of Ti residues. Considerations of dishing, erosion, polish rates, material costs, and logistics lead to a preferred embodiment of the LI slurry utilizing 2 wt % ammonium persulfate and 2 wt % ferric nitrate. However, acceptable ranges are 1.5–9 wt % ferric nitrate, and 0.1–9 wt % ammonium persulfate, depending on the application.

The concentration of ammonium chloride additive in the preferred embodiment of the LI slurry is 2 wt %, with an acceptable range of 0.7–3.0 wt %. Table VI summarizes the experimental results yielding the preferred value.

TABLE VI

Effect of ammonium chloride concentration on defectivity.

| Slurry # | $NH_4Cl$ conc. | Inspex Counts (>0.2 μm) |
|---|---|---|
| 20 | 0.7 wt % | 1972 |
| 21 | 2 wt % | 985/1076 (2 data points) |

Slurries 20 and 21 both are formulated with 2 wt % $Fe^{3+}$ and 2 wt % $S_2O_8^{2-}$. Inspex defect counts are proportional to μ-scratch defect densities. Slurry 21, having 2 wt % ammonium chloride, has lower oxide defectivity than slurry 20 having 0.7 wt % ammonium chloride. It is thought that the higher $NH_4Cl$ concentration, which increases the ionic strength of the slurry by boosting the electrolyte concentration, improves the slurry suspension, thereby aiding defectivity. The increase in ammonium chloride does not affect the polish rates. Chemical stability of the slurry is also improved with the increased $NH_4Cl$.

Using the best mode LI slurry as described above, the polish rate selectivity of tungsten to titanium is 4.4:1, and the selectivity of tungsten to $SiO_2$ is approximately 240:1.

By utilizing the slurry formulations as described above for the tungsten plug and local interconnect slurries, and the slurry preparation method as described above for both formulations, high tungsten and titanium polish rates are seen, with excellent selectivity to oxide polish rate, low oxide microdefect levels, and good chemical stability.

Although the best mode embodiment of the slurry formulation and method utilizes ferric nitrate and ammonium persulfate oxidizing agents, EVERFLO suspension agent, and ammonium chloride stabilizer in the concentrations described above, it is not necessary that this exact formulation be used. Alternative formulations such as those mentioned earlier may be utilized without altering the inventive concept. The scope of the invention should be construed in view of the claims.

With this in mind,
We claim:

1. A chemical-mechanical polishing (CMP) slurry comprising:
   abrasive particles, all said abrasive particles having a median particle diameter less than 0.400 microns and a one sigma deviation about said median diameter of 0.05 microns or less, said particles having a solubility coating thereon, said solubility coating being a phthalate-containing compound;
   a ferric salt oxidizer;
   a suspension agent; and
   a titanium oxidizing agent.

2. The slurry of claim 1, further comprising DI water.

3. The slurry of claim 2, wherein said solubility coating comprises in the range of 0.8–1.1 wt % of said slurry.

4. The slurry of claim 3, comprising 2–6 wt % alumina abrasive particles, 10–30 volume % suspension agent, and
   wherein said solubility coating comprises in the range of 0.8–1.1 wt % of said slurry.

5. The slurry of claim 4, wherein said solubility coating comprises 0.9 wt % of said slurry.

6. The slurry of claim 2, wherein said titanium oxidizing agent is selected from the group consisting of: ammonium persulfate, potassium persulfate, sodium persulfate, citric acid, ceric ammonium nitrate, potassium iodate, and hydrogen peroxide.

7. The slurry of claim 6, wherein said titanium oxidizing agent is ammonium persulfate.

8. The slurry of claim 7, comprising 2–6 wt % alumina abrasive particles, 10–30 volume % suspension agent, and
   wherein said titanium oxidizing agent comprises in the range of 0.1–9.0 wt % of said slurry.

9. The slurry of claim 8, wherein said titanium oxidizing agent comprises 2 wt % of said slurry.

10. The slurry of claim 2, wherein said aqueous suspension agent is selected from the group consisting of: stearic acid, palmitic acid, myristic acid, lauric acid, coconut oil, palm oil, peanut oil, ethylene glycol, propylene glycol, glycerol, polyethylene glycol aliphatic polyethers, alkyl sulfates, alkoxylated alkyphenols.

11. The slurry of claim 10, wherein said suspension agent is an aqueous mixture containing fat and/or fatty acid.

12. The slurry of claim 11 wherein said suspension agent comprises a mixture of stearic acid and a vegetable oil.

13. The slurry of claim 12, wherein said suspension agent is EVERFLO, comprising mostly water, about 12 ½ wt % stearic acid, about 12 ½ wt % vegetable oil, and small amounts of methyl paraben and propylene glycol.

14. The slurry of claim 13, comprising 2–6 wt % alumina abrasive particles,
   wherein said suspension agent comprises in the range of 10–30 volume % of said slurry.

15. The slurry of claim 14, wherein said suspension agent comprises 15 volume % of said slurry.

16. The slurry of claim 2, further comprising a chemical stabilizer.

17. The slurry of claim 16, wherein said chemical stabilizer comprises a soluble chloride salt having a cation inert with respect to the chemicals in the slurry.

18. The slurry of claim 17, wherein said chemical stabilizer is selected from the group consisting of ammonium chloride, potassium chloride, sodium chloride, and $FeCl_3$.

19. The slurry of claim 18, wherein said chemical stabilizer is ammonium chloride.

20. The slurry of claim 19, comprising 2–6 wt % alumina abrasive particles, 10–30 volume % suspension agent, and wherein said chemical stabilizer comprises in the range of 0.7–3.0 wt % of said slurry.

21. The slurry of claim 20, wherein said chemical stabilizer comprises 2 wt % of said slurry.

22. The slurry of claim 2, wherein said abrasive particles are selected from the group consisting of $Al_2O_3$, SiC, $SiO_2$, $CeO_2$ and $Si_3N_4$.

23. The slurry of claim 22, wherein said abrasive particles are $Al_2O_3$.

24. The slurry of claim 23, comprising 10–30 volume % suspension agent, and wherein said abrasive particles comprise in the range of 2–6 wt % of said slurry.

25. The slurry of claim 24, wherein said abrasive particles comprise 2.8 wt % of said slurry.

26. The slurry of claim 23, wherein the median diameter of the abrasive particles is in the range between 0.170 microns and 0.270 microns.

27. The slurry of claim 2, wherein said ferric salt oxidizer is selected from the group consisting of $Fe(NO_3)_3.9H_2O$, $Fe_2(SO_4)_3.5H_2O$, $FeCl_3.6H_2O$, and $FeNH_4(SO_4)_2.12H_2O$.

28. The slurry of claim 27, wherein said ferric salt oxidizer is $Fe(NO_3)_3.9H_2O$.

29. The slurry of claim 28, comprising 2–6 wt % alumina abrasive particles, 10–30 volume % suspension agent, and wherein said ferric salt oxidizer comprises 2 wt % of said slurry.

30. The slurry of claim 29, wherein said ferric salt oxidizer comprises 2 wt % of said slurry.

31. A method for making a chemical-mechanical polishing (CMP) slurry comprising the steps of:

providing abrasive particles in an aqueous concentrate having a median particle diameter less than 0.400 microns;

blending said abrasive particles in said aqueous concentrate with a suspension agent;

then mixing water and at least two different oxidizers including a ferric salt oxidizer and a titanium oxidizing agent with said blended abrasive particles to form a slurry.

32. The method of claim 31 wherein said step of providing said abrasive particles includes said abrasive particles having a solubility coating thereon.

33. The method of claim 32 wherein said abrasive particles are $Al_2O_3$.

34. The method of claim 33 wherein said solubility coating is ammonium hydrogen phthalate.

35. The method of claim 34 wherein said suspension agent is EVERFLO, comprising mostly water, about 12 ½ wt % stearic acid, about 12 ½ wt % vegetable oil, and small amounts of methyl paraben and propylene glycol.

36. The method of claim 35 wherein said titanium oxidizing agent is ammonium persulfate.

37. The method of claim 36 wherein said ferric salt oxidizer is $Fe(NO_3)_3.9H_2O$.

38. The method of claim 37 further including the step of mixing a chemical stabilizer with said slurry.

39. The method of claim 38 wherein said chemical stabilizer is ammonium chloride.

40. The method of claim 39 wherein the median diameter of the abrasive particles is in the range between 0.170 microns and 0.270 microns.

41. The method of claim 40 wherein said step of blending said abrasive particles includes physically vigorously mixing said particles in said aqueous concentrate with said suspension agent for a time on the order of two hours before addition of said water.

42. The method of claim 41 wherein said abrasive particle concentrate is 20 volume %, said ammonium hydrogen phthalate is 0.9 wt %, said suspension agent is 15 volume %, said water is 65 volume %, said ferric nitrate is 2 wt %, said ammonium persulfate is 2 wt %, and said ammonium chloride is 2 wt %.

43. A Chemical Mechanical Polishing (CMP) slurry made by the method of claim 31.

44. A Chemical Mechanical Polishing (CMP) slurry made by the method of claim 35.

45. A Chemical Mechanical Polishing (CMP) slurry made by the method of claim 38.

46. A Chemical Mechanical Polishing (CMP) slurry made by the method of claim 39.

47. A Chemical Mechanical Polishing (CMP) slurry made by the method of claim 42.

48. The Chemical-Mechanical Polishing (CMP) slurry of claim 1, wherein said solubility coating comprises a phthalate-containing compound including ammonium hydrogen phthalate.

49. The Chemical-Mechanical Polishing (CMP) slurry of claim 1, wherein said solubility coating comprises a phthalate-containing compound including phthalic acid.

50. The Chemical-Mechanical Polishing (CMP) slurry of claim 1, wherein said solubility coating comprises a phthalate-containing compound including diammonium phthalate.

51. The Chemical-Mechanical Polishing (CMP) slurry of claim 1, wherein said solubility coating comprises a phthalate-containing compound including potassium phthalate.

52. The Chemical-Mechanical Polishing (CMP) slurry of claim 1, wherein said solubility coating comprises a phthalate-containing compound including sodium phthalate.

53. A chemical-mechanical polishing (CMP) slurry comprising:

a ferric salt oxidizer;

a suspension agent;

a titanium oxidizing agent; and abrasive particles, all said abrasive particles having a median particle diameter less than 0.400 microns and a one sigma deviation about said median diameter of 0.05 microns or less, said particles having a solubility coating thereon, said solubility coating being selected from the group consisting of: ammonium hydrogen phthalate, phthalic acid, diammonium phthalate, mono- or di- potassium or sodium phthalate, sodium acetylacetonate monohydrate, potassium acetylacetonate hemihydrate, succinic acid, ammonium succinate, sodium succinate, potassium succinate, 2,3-naphthalene dicarboxylic acid, 2,6-naphthalene dicarboxylic acid.

* * * * *